United States Patent
Chen et al.

(10) Patent No.: US 8,622,492 B2
(45) Date of Patent: Jan. 7, 2014

(54) POSITIONING MECHANISM FOR QUICK RELEASE DEVICE OF SLIDE ASSEMBLY

(75) Inventors: Ken-Ching Chen, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 224 days.

(21) Appl. No.: 13/162,779

(22) Filed: Jun. 17, 2011

(65) Prior Publication Data

US 2012/0321230 A1 Dec. 20, 2012

(51) Int. Cl.
*A47B 95/00* (2006.01)

(52) U.S. Cl.
USPC .................................. 312/333; 312/348.2

(58) Field of Classification Search
USPC ............. 312/319.1, 330.1, 333, 334.1, 334.2, 312/334.5, 334.7, 348.2; 384/22, 41
See application file for complete search history.

(56) References Cited

U.S. PATENT DOCUMENTS

| | | | |
|---|---|---|---|
| 6,209,979 B1 | 4/2001 | Fall et al. | |
| 6,585,337 B1 * | 7/2003 | Chen et al. | 312/334.46 |
| 6,588,866 B2 | 7/2003 | Cheng | |
| 6,601,933 B1 * | 8/2003 | Greenwald | 312/333 |
| 6,938,967 B2 | 9/2005 | Dubon et al. | |
| 6,948,691 B2 | 9/2005 | Brock et al. | |
| 7,604,307 B2 | 10/2009 | Greenwald et al. | |
| 7,850,369 B2 | 12/2010 | Young et al. | |
| 7,871,139 B2 | 1/2011 | Yu et al. | |
| 2007/0018547 A1 * | 1/2007 | Yang et al. | 312/333 |
| 2007/0114895 A1 * | 5/2007 | Chen et al. | 312/333 |

FOREIGN PATENT DOCUMENTS

CN 200910304796.9 * 7/2009 ............ F16M 13/00

* cited by examiner

*Primary Examiner* — Darnell Jayne
*Assistant Examiner* — Sasha T Varghese
(74) *Attorney, Agent, or Firm* — Rosenberg, Klein & Lee

(57) ABSTRACT

A positioning mechanism for a quick release device of a slide assembly includes an opening in the rail and a positioning member located corresponding to the opening. The rail has a first contact portion adjacent to the opening which has an open portion and a reception portion communicating with the open portion. The positioning member includes a base, a resilient arm, a restriction portion and a second contact portion. The base is fixed to the rail. The resilient arm is connected between the base and the restriction portion. The restriction portion has a first contact end located corresponding to the open portion. The second contact portion is connected to the restriction portion. An substantially enclosed area is defined between the first contact end and the reception portion. The second contact portion contacts the first contact portion of the rail such that the first contact end is secured.

6 Claims, 7 Drawing Sheets

US 8,622,492 B2

POSITIONING MECHANISM FOR QUICK RELEASE DEVICE OF SLIDE ASSEMBLY

FIELD OF THE INVENTION

The present invention relates to a positioning mechanism for a quick release device, and more particularly, to a positioning mechanism for quickly and securely connecting an instrument to a slide assembly.

BACKGROUND OF THE INVENTION

A conventional positioning mechanism for quickly and securely connecting an instrument to a slide assembly generally includes a keyhole slot defined in the rail of the slide assembly and a resilient member is fixed to the rail and located corresponding to the keyhole slot. The keyhole slot includes an enlarged hole and a narrow hole which communicates with the enlarged hole. The resilient member extends to the keyhole slot and covers the enlarged hole. When assembling the instrument to the slide assembly, the fixing pin on one side of the instrument is located corresponding to the keyhole slot and inserted into the enlarged hole, and then the fixing pin is shifted into the narrow hole and positioned by being biased by the resilient member, such that the instrument is connected to the rail. Generally, the rail compared with other rails of the slide assembly can be pulled out from the slide assembly and the rails are connected to the two sides of the instrument in pairs. The instrument is connected to the slide assembly on the rack so that the instrument is supported on the rack by the slide assembly.

However, when installing the instrument to the rack, the instrument is pulled out and pushed into the rack, or the vibration from the site, the fixing pin and the resilient member may have compact to each other. If the resilient member cannot bear the impact, it is easily deformed and the positioning function of the resilient member fails.

U.S. Pat. No. 7,604,307 to Greenwald et al. discloses a "telescoping slide assembly with quick-mount keyhole lock system" which provides a positioning hole for the resilient member so that when the fixing pin is inserted into the keyhole slot and shifted to a pre-set position, the fixing pin extends into the positioning hole and is well positioned.

U.S. Pat. No. 6,626,300 to Kaminski et al. discloses a "rack assembly that does not require tools for coupling chassis to slide", wherein an end of the resilient member contacts against the fixing pin to be positioned.

Obviously, the above-mentioned disclosures provide a positioning device for positioning the instrument or chassis to the slide assembly, but the problem of the deformation of the resilient member and the potential risk to the resilient member are not resolved. Therefore, a better design for avoiding the deformation of the resilient member under impact is necessary.

SUMMARY OF THE INVENTION

The present invention relates to a positioning mechanism for a quick release device of a slide assembly and comprises a rail having an opening defined in the rail and a first contact portion located adjacent to the opening. The opening has an open potion and a reception portion which communicates with the open portion. A positioning member has a base, a resilient arm, a restriction portion and a second contact portion, wherein the positioning member is fixed to the rail by the base and located corresponding to the opening. The resilient arm is connected between the base and the restriction portion.

The resilient arm is movably away from the rail to change position of the restriction portion. The restriction portion has a first contact end located corresponding to the reception portion. The second contact portion is connected to the restriction portion. An enclosed area is defined between the first contact end and the reception portion. The second contact portion contacts the first contact portion of the rail.

Preferably, the first contact portion is a hole or a recessed area, and the second contact portion is a protrusion. The second contact portion is inserted into the first contact portion.

Preferably, the first contact portion is a protrusion and the second contact portion is a hole or a recessed area. The first contact portion is inserted into the second contact portion.

Preferably, the first contact portion is a protrusion and the second contact portion is a protrusion. The first contact portion contacts the second contact portion.

Preferably, the restriction portion has a bent plate.

Preferably, the bent plate has a second contact end and an operation end. The second contact end is located corresponding to the first contact end of the restriction portion and the operation end is located corresponding to the second contact end.

Preferably, the bent plate has a protrusion located adjacent to the operation end and a gap is defined between the protrusion and a surface of the restriction portion.

Preferably, a window is defined between the resilient arm and the restriction portion. The window is located corresponding to the operation end of the bent plate.

The primary object of the present invention is to provide a positioning mechanism for a quick release device wherein the structural strength of the resilient member is reinforced so as to prevent fail positioning.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
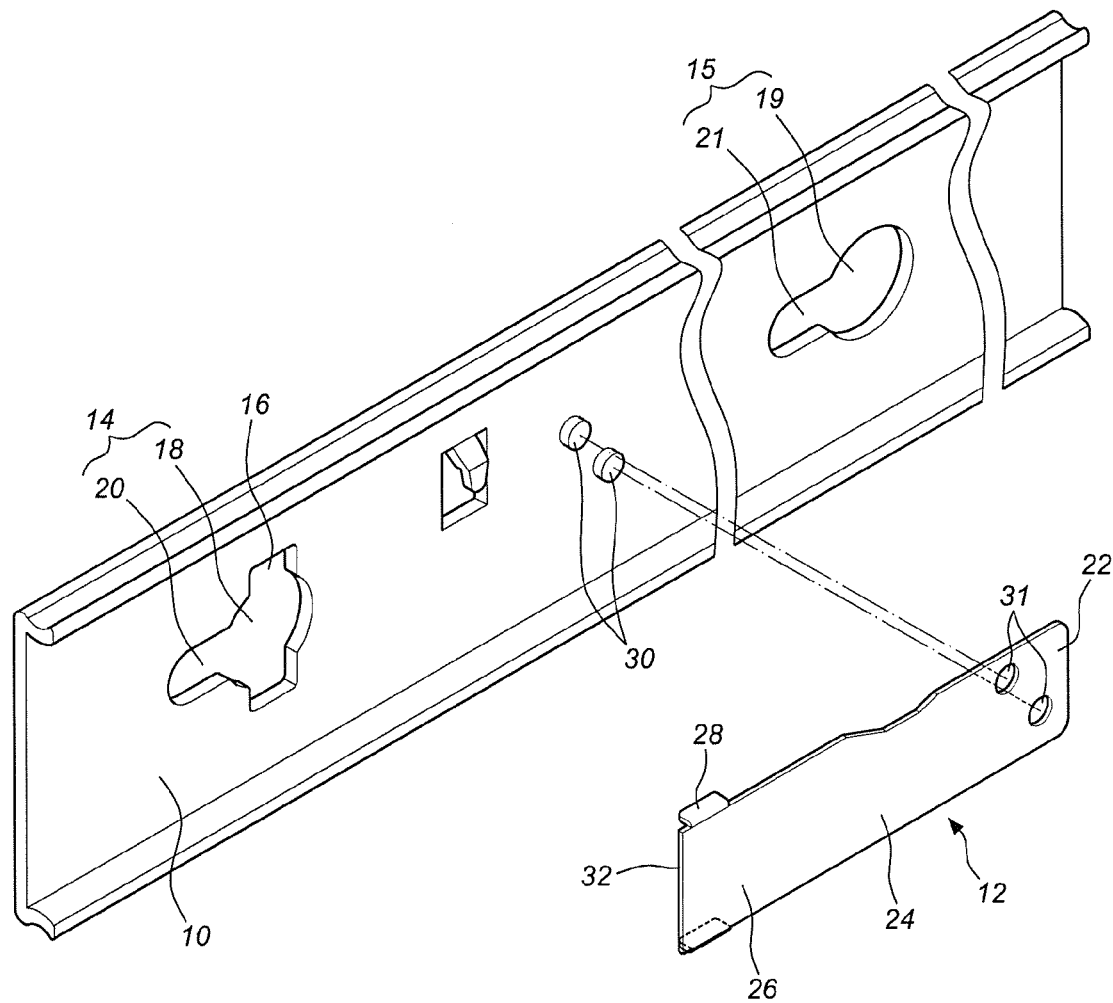
FIG. 1 is an exploded view to show the rail and the positioning member of the positioning mechanism of the present invention.
Figure 2:
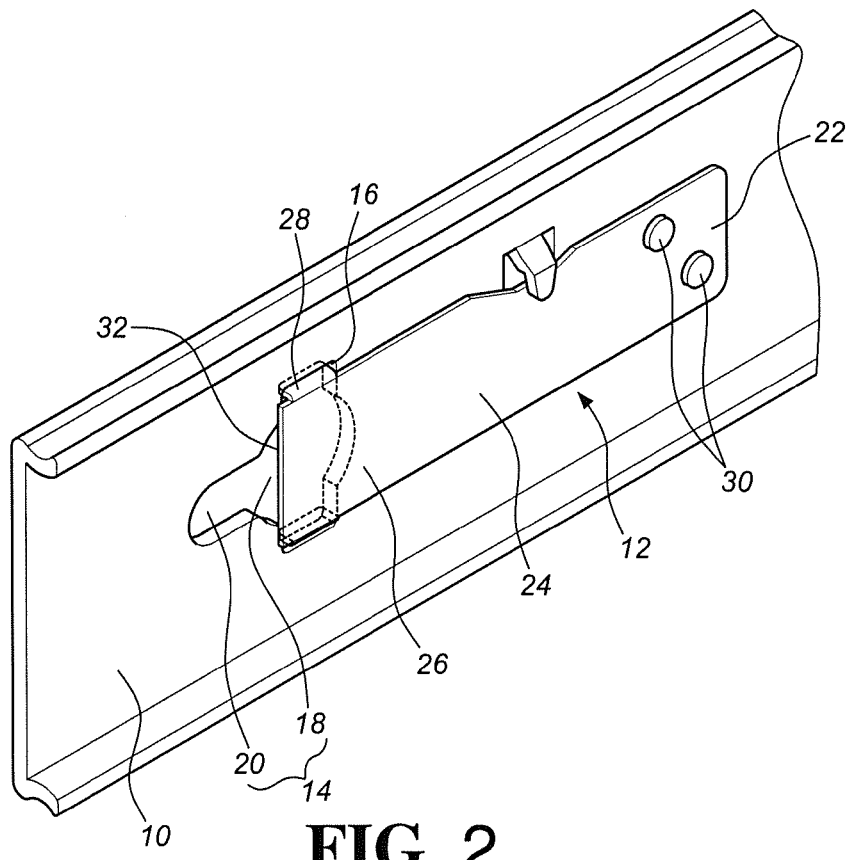
FIG. 2 is a perspective view to show the connection of the rail and the positioning member, and the first contact relationship of a preferable embodiment of the positioning mechanism of the present invention.

Referring to FIGS. 1 and 2, the positioning mechanism for a quick release device of a slide assembly of the present invention comprises a rail 10 and a positioning member 12.

The rail 10 has at least two openings 14, 15 defined in the rail 10 and a first contact portion 16. The opening 14 includes an open potion 18 and a reception portion 20 which communicates with the open portion 18. The opening 15 includes an open potion 19 and a reception portion 21 which communicates with the open portion 19. The first contact portion 16 is located adjacent to one of the openings 14, 15, for example, adjacent to the opening 14. In this embodiment, the open portions 18, 19 are enlarged holes which are larger than the reception portions 20, 21. The reception portions 20, 21 are narrow holes which are smaller than the open portions 18, 19.

The positioning member 12 includes a base 22, a resilient arm 24, a restriction portion 26 and a second contact portion 28. The positioning member 12 is fixed to the rail 10 by a connecting means. For example, the rail 10 has bosses 30 at the position where rivet holes 31 of the base 22 are located so that the bosses 30 are riveted with the rivet holes 31. The positioning member 12 corresponds in position to the opening 14 of the rail 10. The resilient arm 24 is connected between the base 22 and the restriction portion 26, and the resilient arm 24 is movable away from the rail 10 to change position of the restriction portion 26 relative to the opening 14 of the rail 10. The restriction portion 26 has a first contact end 32 located corresponding to the reception portion 20 of the opening 14. The second contact portion 28 is connected to the restriction portion 26. An enclosed area is defined between the first contact end 32 and the reception portion 20, and the second contact portion 28 contacts the first contact portion 16 of the rail 10.

According to the above mentioned connection, the engagement between the first contact portion 16 of the rail 10 and the second contact portion 28 of the positioning member 12 has three embodiments.

The first one is that the first contact portion 16 is a reception means such as a hole or a recessed area. A hole is shown in the drawings. The second contact portion 28 is a protrusion. The second contact portion 28 is inserted into the first contact portion 16.

Figure 3:
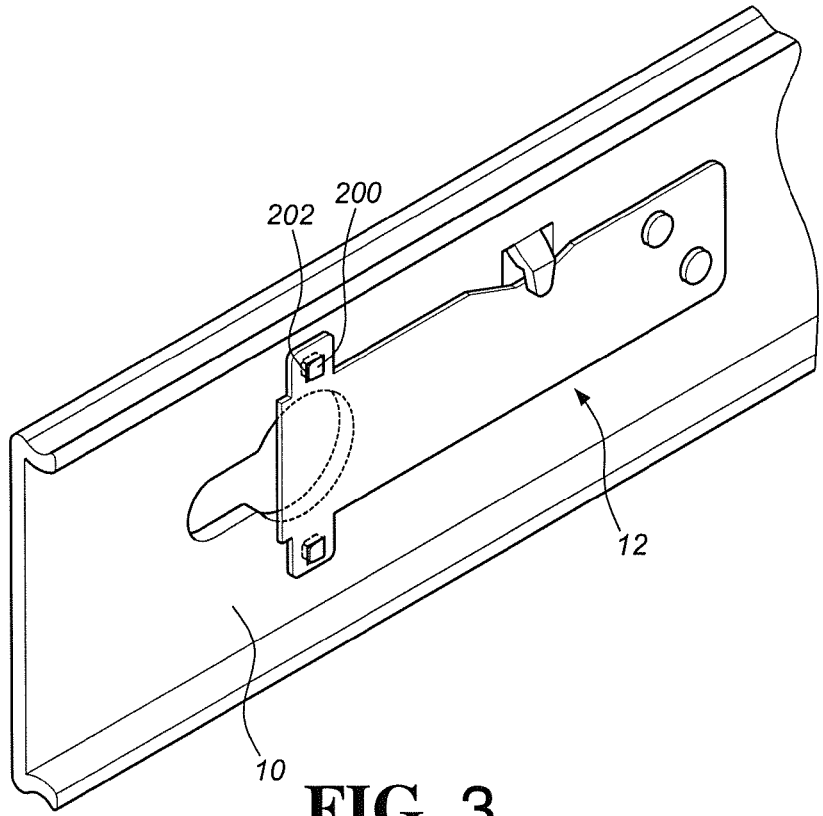
FIG. 3 is a perspective view to show the connection of the rail and the positioning member, and the second contact relationship of a preferable embodiment of the positioning mechanism of the present invention.

The second one is shown in FIG. 3, wherein the first contact portion 200 is a protrusion, the second contact portion 202 of the positioning member 12 is a reception means such as a hole or a recessed area. A hole is shown in the drawings. The first contact portion 200 is inserted into the second contact portion 202.

Figure 4:
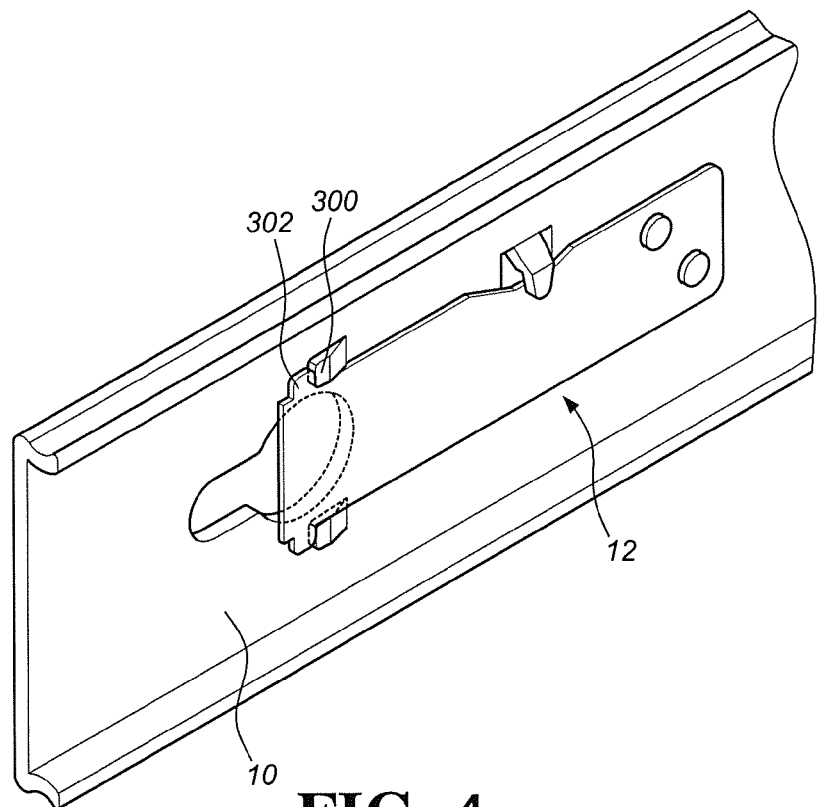
FIG. 4 is a perspective view to show the connection of the rail and the positioning member, and the third contact relationship of a preferable embodiment of the positioning mechanism of the present invention.

The third one is shown in FIG. 4, wherein the first contact portion 300 is a protrusion and the second contact portion 302 of the positioning member 12 is also a protrusion. The first contact portion 300 contacts the second contact portion 302.

Figure 5:
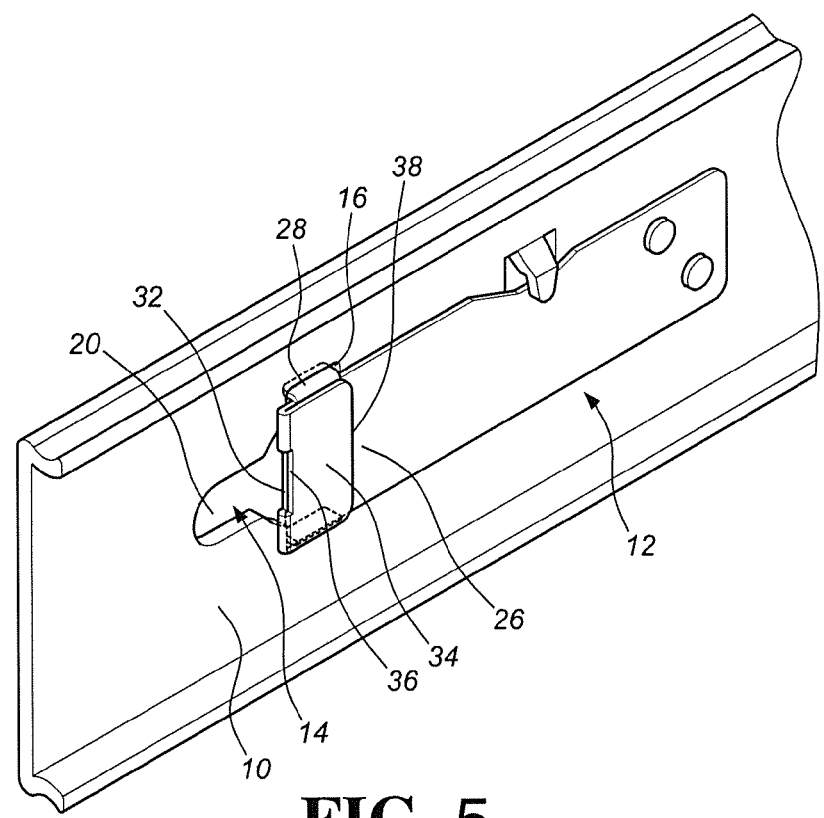
FIG. 5 shows a preferable embodiment of the positioning member which has a bent plate overlapped on the positioning member.

As shown in FIG. 5, a preferable embodiment is shown, wherein the restriction portion 26 has a bent plate 34. Preferably, the bent plate 34 has a second contact end 36 which is in alignment with the first contact end 32 of the restriction portion 26. The first and second contact ends 32 and 36 are located corresponding to the reception portion 20 of the opening 14. The bent plate 34 has an operation end 38 located corresponding to the second contact end 36 of the restriction portion 26.

Figure 6:
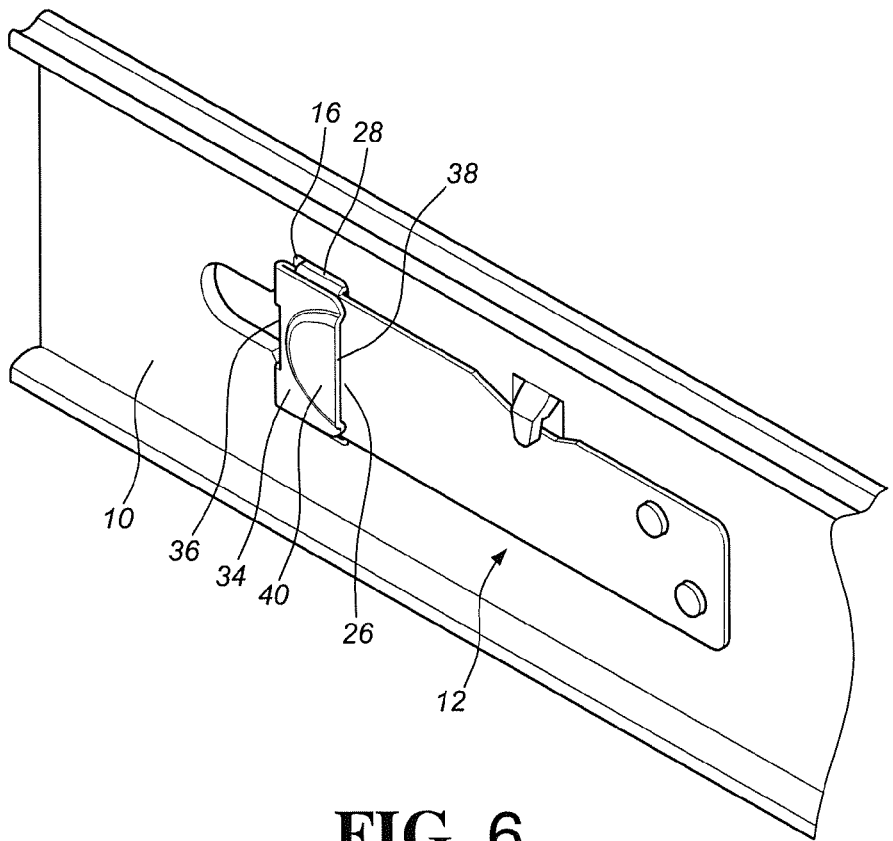
FIG. 6 shows a preferable embodiment of the positioning member which has a bent plate in the form of a protrusion.

In a preferable embodiment, as shown in FIG. 6, the bent plate 34 has a protrusion 40 located adjacent to the operation end 38 and a gap is defined between the protrusion 40 and a surface of the restriction portion 26 so that the user can insert a finger or a tool in the gap to contact the operation end 38 to operate the restriction portion 26.

Figure 7:
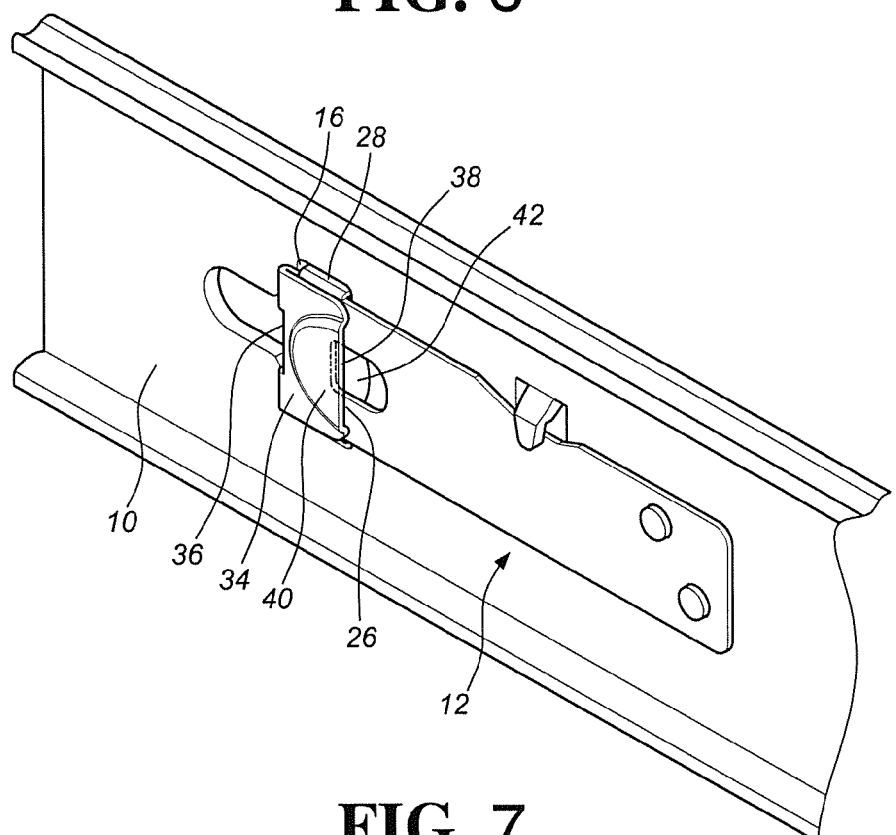
FIG. 7 shows a preferable embodiment of the positioning member which has a window.

In a preferable embodiment, as shown in FIG. 7, a window 42 is defined between the resilient arm 24 and the restriction portion 26, and the window 42 is located corresponding to the operation end 38 of the bent plate 34. The window 42 is convenient for operation of the user by inserting a finger or a tool in the window 42 to contact the operation end 38 to operate the restriction portion 26.

Figure 8:
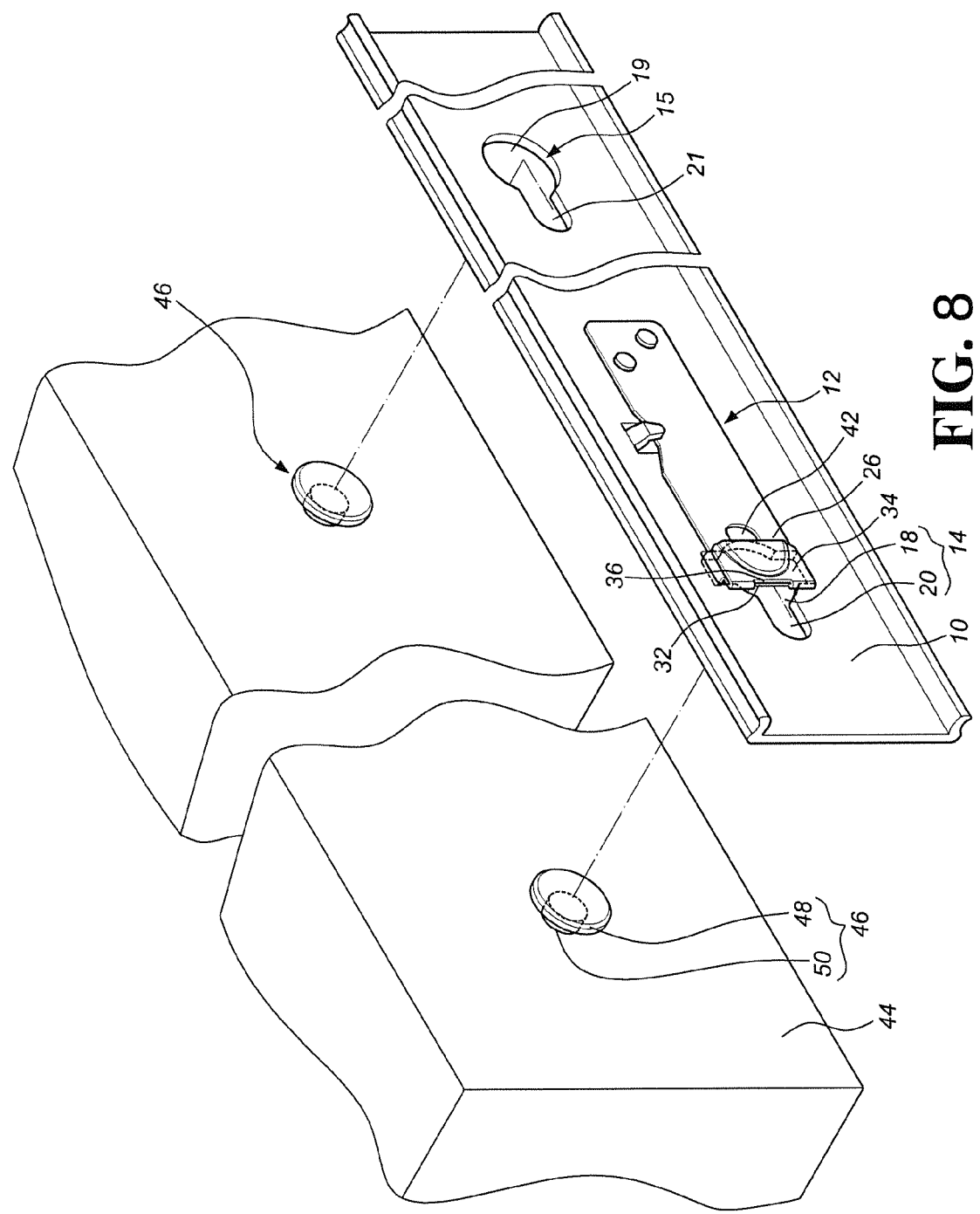
FIG. 8 shows a preferable embodiment of the connection of the rail and the chassis.

For an application similar to the present invention, a pair of rails are respectively connected to two sides of a chassis such as a server, computer or storage unit. As shown in FIG. 8, there are multiple installation members 46 located on a side of the chassis 44 so as to be connected with the rail 10. Each installation member 46 has a head 48 and a body 50 which is connected to the head 48, wherein the diameter of the head 48 is larger than the diameter of the body 50, and smaller than the diameter of the open portions 18, 19 of the openings 14, 15 in the rail 10. The diameter of the reception portions 20, 21 of the openings 14, 15 in the rail 10 is larger than the diameter of the body 50 of the installation members 46, and smaller than the diameter of the head 48 of the installation members 46.

Figure 9:
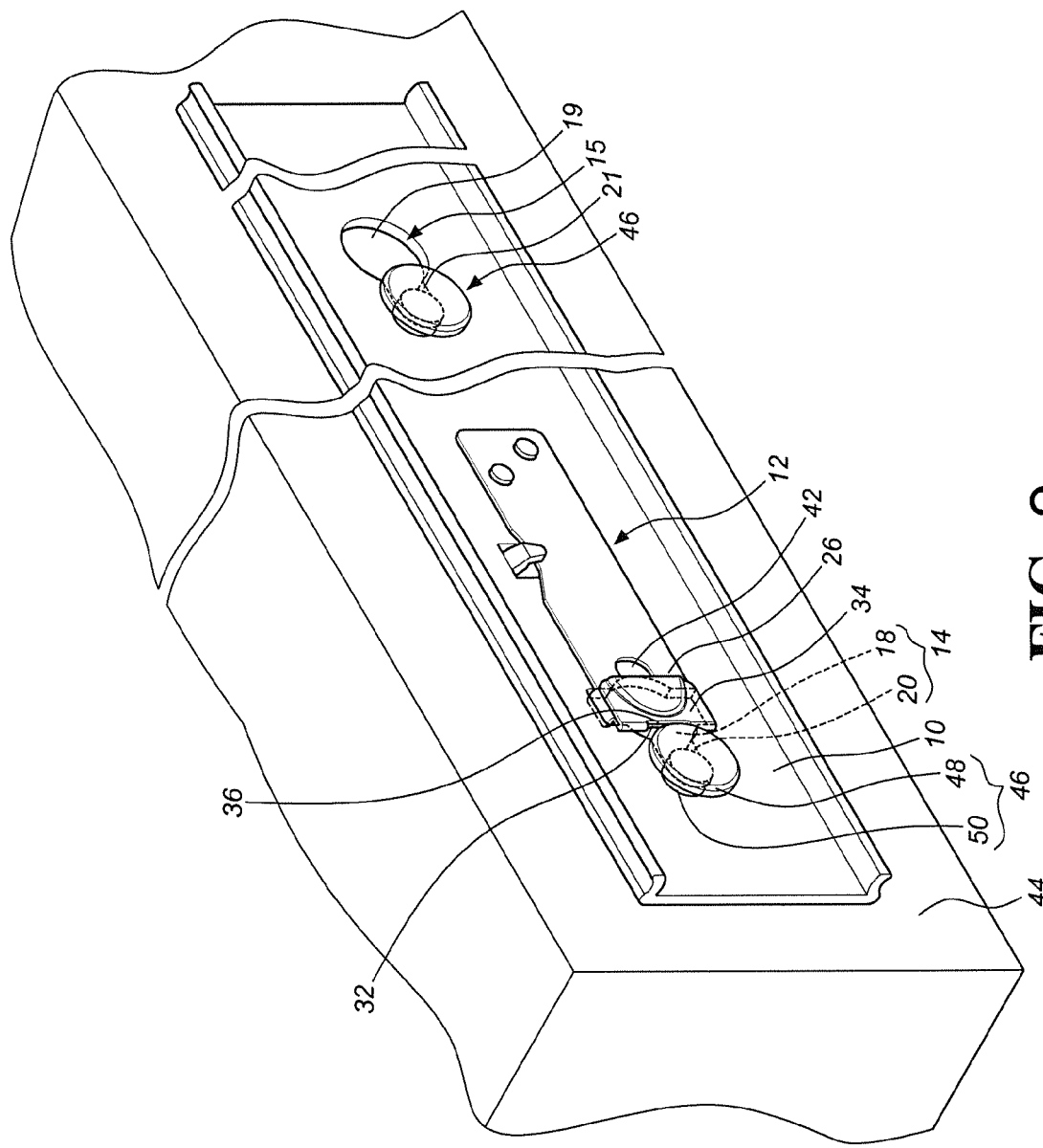
FIG. 9 shows a preferable embodiment of the positioning of the connection of the rail and the chassis.

As shown in FIGS. 8 and 9, the heads 48 and the bodies 50 of the installation members 46 are directly inserted into the open portions 18, 19 of the openings 14, 15 of the rail 10, and the bodies 50 are shifted into the reception portions 20, 21 of the openings 14, 15 and contact the inside of the reception portions 20, 21. The first contact end 32 of the restriction portion 26 of the positioning members 12 and the second contact end 36 of the bent plate 34 are in contact with one of the installation members 46. One of the installation members 46 is in contact with the first and second contact ends 32 and 36 of the positioning member 12 and located in the enclosed area defined by the positioning member 12 and the reception portion 20. The installation members 46 are then restricted and cannot move. The second contact portion 28 of the positioning member 12 is inserted into the first contact portion 16 of the rail 10 and contacts the first contact portion 16. The positioning member 12, relative to the rail 10, contacts against the first contact portion 16. When the impact from one of the installation members 46 is applied to the positioning member 12, the second and first contact portions 28, 16 receive the impact, and the restriction portion 26 and the resilient arm 24 are not overly deformed, so that the positioning member 12 is firmly secured relative to one of the installation members 46.

Furthermore, when viewing through the window 42 of the positioning member 12, the user confirms the correct installation to one of the installation members 46. The window 42 also allows the user to move the resilient arm 24 of the positioning member 12 relative to the rail 10.

Figure 10:
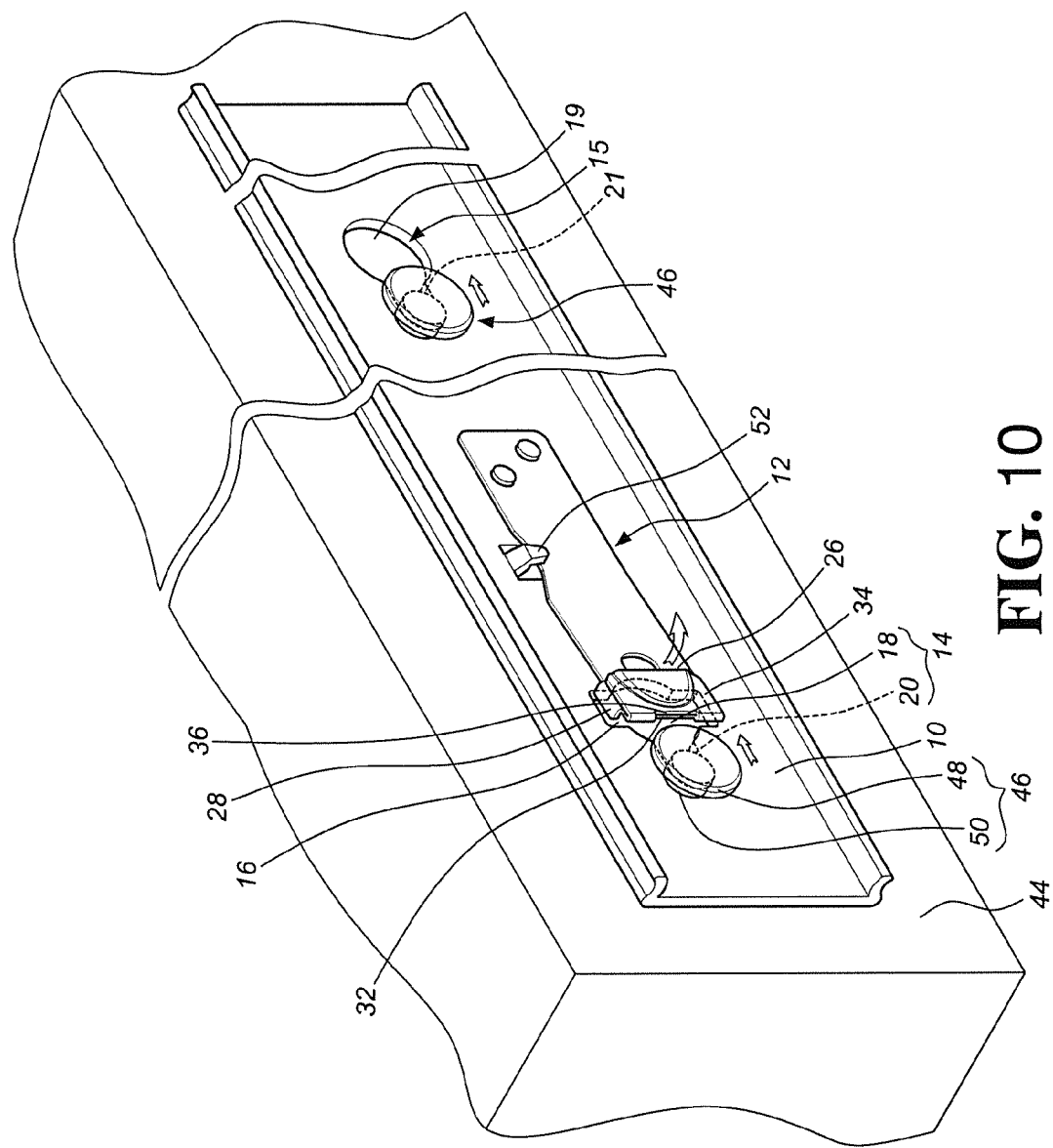
FIG. 10 shows a preferable embodiment of the installation member of the chassis being disengaged from the rail.

As shown in FIG. 10, when the resilient arm 24 of the positioning member 12 is operated by the user and removed from the rail 10 an angle, the restriction portion 26 changes its position relative to the opening 14 of the rail 10 and is separated from one of the installation members 46. The second contact portion 28 is removed from the first contact portion 16 of the rail 10. In addition, the rail 10 has a hook 52 contacting the resilient arm 24 to control the resilient arm 24 not to be overly bent. In this status, one of the installation members 46 is not restricted by the positioning member 12 and all of the installation members 46 are shifted from the reception portions 20, 21 of the openings 14, 15 to the open portions 18, 19. Therefore, the installation members 46 are removed from the openings 14, 15.

As mentioned above, when the chassis 44 on the rail 10 is installed to a rack (not shown), the chassis 44 is protected by the positioning member 12 which bears the impact from one of the installation members 46 or from outside of the rail 10. The mutual contact between the second contact portion 28 of the restriction portion 26 and the first contact portion 16 of the rail 10, the restriction portion 26 of the positioning member 12 and the resilient arm 24 are prevented from being permanently deformed and damaged.

While we have shown and described the embodiment in accordance with the present invention, it should be clear to those skilled in the art that further embodiments may be made without departing from the scope of the present invention.

What is claimed is:

1. A positioning mechanism for a quick release device of a slide assembly, comprising:

a rail having an opening defined in the rail and a first contact portion located adjacent to the opening, the opening having an open portion and a reception portion which communicates with the open portion, and a positioning member having a base, a resilient arm, a restriction portion and a second contact portion, the positioning member being fixed to the rail by the base and located corresponding to the opening, the resilient arm being connected between the base and the restriction portion, wherein the resilient arm is transversely movable from the rail to change position of the restriction portion, the restriction portion having a first contact end located corresponding to the open portion, the second contact portion being connected to the restriction portion, a substantially enclosed area being defined between the first contact end and the reception portion, and the second contact portion contacting the first contact portion of the rail to substantially inhibit vertical movement and longitudinal movement of the positioning member relative to the rail;

wherein the restriction portion has a bent plate having a second contact end and an operation end, the second contact end is located corresponding to the first contact end of the restriction portion, and the operation end is located corresponding to the second contact end.

2. The positioning mechanism as claimed in claim 1, wherein the first contact portion is one of a hole and a recessed area, the second contact portion is a protrusion, and the second contact portion is inserted into the first contact portion.

3. The positioning mechanism as claimed in claim 1, wherein the first contact portion is a protrusion, and the second contact portion is one of a hole and a recessed area, and the first contact portion is inserted into the second contact portion.

4. The positioning mechanism as claimed in claim 1, wherein the first contact portion is a protrusion and the second contact portion is a protrusion, and the first contact portion contacts the second contact portion.

5. The positioning mechanism as claimed in claim 1, wherein the bent plate has a protrusion located adjacent to the operation end and a gap is defined between the protrusion and a surface of the restriction portion.

6. The positioning mechanism as claimed in claim 1, wherein a window is defined between the resilient arm and the restriction portion and the window is located corresponding to the operation end of the bent plate.

* * * * *